United States Patent [19]

Reed

[11] 4,042,915
[45] Aug. 16, 1977

[54] MOS DYNAMIC RANDOM ACCESS MEMORY HAVING AN IMPROVED ADDRESS DECODER CIRCUIT

[75] Inventor: John A. Reed, Los Altos, Calif.

[73] Assignee: National Semiconductor Corporation, Santa Clara, Calif.

[21] Appl. No.: 677,461

[22] Filed: Apr. 15, 1976

[51] Int. Cl.² .............................................. G11C 8/00
[52] U.S. Cl. ............................ 340/173 R; 307/205; 340/347 DD
[58] Field of Search ................... 340/173 R, 347 DD; 307/205

[56] References Cited

U.S. PATENT DOCUMENTS 3,721,964   3/1973   Barrett et al. .................... 340/173 R

*Primary Examiner*—Stuart N. Hecker
*Attorney, Agent, or Firm*—Gail W. Woodward; Willis E. Higgins

[57] ABSTRACT

In an MOS dynamic random access memory, address input signals are received by individual comparator buffers which generate corresponding individual pairs of complementary address signals in response to respective ones of the input address signals. The pairs of complementary address signals are strobed from the buffers. Each pair of complementary address signals, as strobed from the individual buffers, diverge from a common potential to a pair of stable complementary address signals which are fed to an array of decoder circuits. Each decoder circuit includes an output line which is precharged to a predetermined potential and is selectively discharged in response to the decoded address signals via a plurality of parallel connected decoder transistors. Each decoder transistor includes a gate control electrode for controlling the conduction between first and second other terminals of the respective transistors. The first terminals are connected to the decoder output line. The pairs of complementary address signals are applied between the gate and second terminals of respective ones of the decoder transistors such that as the complementary address signals diverge sufficiently in amplitude to exceed the turn-on threshold of the individual decoder transistors, those transistors will be rendered conductive for discharging the output line of the respective decoded circuit. Thus, the timing for strobing of the decoder circuit is automatically obtained by the pairs of complementary output signals of the respective address buffers and these address signals need not be held at any predetermined voltage during precharging of the respective decoder output line.

2 Claims, 4 Drawing Figures

Fig_1

4,042,915

MOS DYNAMIC RANDOM ACCESS MEMORY HAVING AN IMPROVED ADDRESS DECODER CIRCUIT

BACKGROUND OF THE INVENTION

The present invention relates in general to MOS dynamic random access memories and more particularly to an improved address decoder circuit for use therein.

DESCRIPTION OF THE PRIOR ART

Heretofore, MOS dynamic random access memories have included self-timing decoder circuits of the type wherein a plurality of decoding transistors were connected in parallel to a precharged output line of the decoder for selectively discharging the decoder output line to ground in accordance with strobed buffered address signals applied to the gates of the respective decoder transistors. The problem with this type of prior art decoder circuit is that the address signals must be held at ground potential during precharging of the decoder output line and prior to the actual decoding step in order to prevent inadvertent discharge of the respective decoder output line.

In a second type of prior art decoding circuit for use in such a memory, the buffered address signals were applied to the gate electrodes of the parallel connected decoding transistors, whereas the sets of terminals of the decoder transistors which were not connected to the decoder output line were connected to an enable bus which was strobed to enable the respective decoder circuit. The problem with this circuit is that it requires an extra timing signal, namely, the enable signal, which is to be held at or near the precharged potential of the decoder output line. Decoding does not occur until the extra timing signal is taken to a potential close to ground.

Thus, it is desired to provide an improved decoder circuit, for use in such memories, which does not require that the address signals to be decoded, be at any particular voltage during precharging of the output decoder circuit line and which does not require the generation of a separate or extra timing signal.

SUMMARY OF THE PRESENT INVENTION

The principal object of the present invention is the provision of an improved address decoder circuit for use in MOS dynamic random access memories.

In one feature of the present invention, a comparator buffer circuit receives address signals and generates pairs of complementary buffered address signals which are applied between the gate and non-common terminal of respective ones of decoder transistors connected in parallel to a prechargeable output line of the decoder circuit. Respective ones of the decoder transistors are rendered conductive in response to a predetermined polarity of said pair of complementary buffered address signals, whereby the decoder circuit is strobed by the timing of the buffered pair of complementary address signals.

In another feature of the present invention, the comparator buffer for generating the pair of complementary buffered address signals includes a clock terminal responsive to a clock signal for strobing the comparator buffer and wherein the pair of output signals of the buffer are at a common potential prior to strobing and in response to the strobe signals the pair of buffered output signals diverge from the common potential into a pair of complementary address signals at substantially different potentials to be applied to the inputs of respective ones of said decoder transistors, whereby the input signals to the respective decoder transistors are at the same potential during the precharging portion of the decoder circuit and diverge into the complementary pair of substantially different amplitude address signals only upon strobing of the respective comparator buffer circuits.

Other features and advantages of the present invention will become apparent upon a perusal of the following specification taken in connection with the accompanying drawing wherein:

DESCRIPTION OF THE PREFERRED EMBODIMENTS

Figure 1:
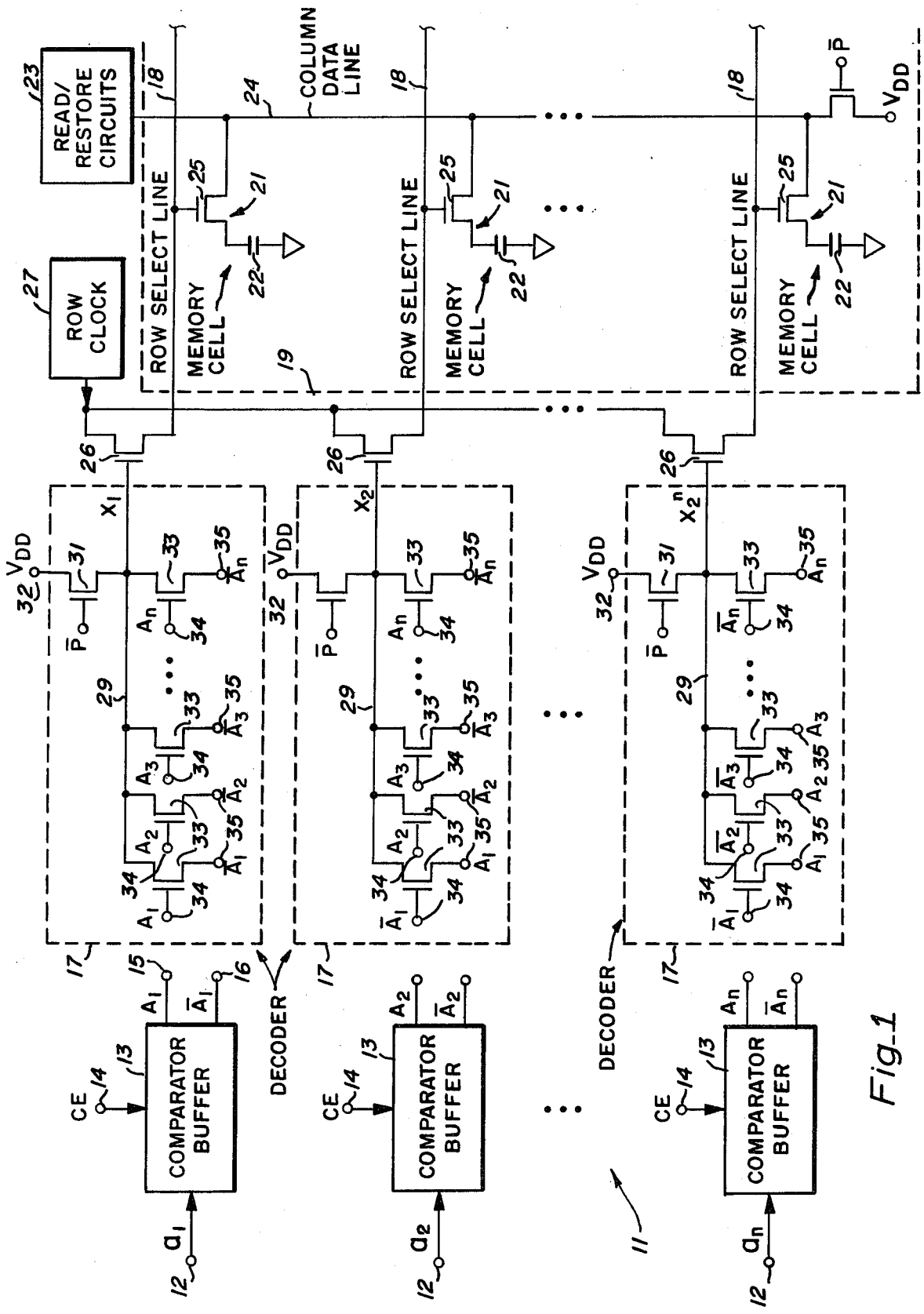
FIG. 1 is a schematic circuit diagram, partly in block diagram form, of an MOS dynamic random access memory incorporating an improved address decoder circuit of the present invention.

Referring now to FIG. 1, there is shown an MOS dynamic random access memory circuit 11 incorporating features of the present invention. In the memory circuit 11, coded input address signals $a_1, a_2 \ldots a_n$ are received on respective input address terminals 12 and applied to the input of respective comparator buffer circuits 13 for converting the input address signals $a_1, a_2 \ldots a_n$ into corresponding pairs of complementary address $A_1, \overline{A}_1; A_2, \overline{A}_2 \ldots A_n, \overline{A}_n$. In a typical example, the comparator buffer circuits 13 are the same as those utilized in the commercially available Texas Instruments Model TMS 4030 or the Intel Model I 2107B Dynamic 4K Random Access Memory Integrated Circuits.

The address comparator buffer 13 includes a clock input terminal 14 on which a clock (chip enable) signal CE is received for strobing the operation of the address comparator buffer circuit 13. The address comparator buffer circuit 13 also includes a pair of output terminals 15 and 16 on which the pair of complementary buffered address signals $A_1, \overline{A}_1; A_2, \overline{A}_2; \ldots A_n, \overline{A}_n$ are outputed in response to the respective input signals $a_1, a_2 \ldots a_n$ and the strobe signal CE (see curve 41 of waveform (a) of FIG. 4). More particularly, the pair of complementary output buffered address signals A, $\overline{A}$ are shown by waveform (b) of FIG. 4. In the absence of the clock signals CE, both the address signals of each pair, A and $\overline{A}$, have the same electrical potential or voltage which may be at any voltage and need not be at ground potential or some predetermined positive supply potential, such as $V_{DD}$. However, upon strobing of the respective address comparator buffer circuit 13 with the clock signal CE, the complementary pair of output signals A, $\overline{A}$ on the output terminals 15 and 16 are caused to diverge in amplitude with one of the signals going to a potential near the positive supply potential $V_{DD}$, of approximately 12 volts, whereas the other address signal of each pair goes to approximately zero volts, i.e., ground potential. The address comparator buffer 13 includes an internal voltage level reference for comparison with the address input signal $a_1-a_n$ so that if the voltage of the input signal a exceeds 1.5 volts one of the outputs A or $\overline{A}$ goes from the common voltage to $V_{DD}$ potential, whereas the other output of the complementary pair A or $\overline{A}$ goes to ground or 0 volts. If the input signal a is less than 1.5 volts, the one output goes to 0 volts and the other output goes to $V_{DD}$ potential.

The buffered pairs of complementary output address signals A, $\overline{A}$ as generated at the outputs of the address comparator buffer circuits 13 are fed to respective decoder circuits 17 for decoding and for addressing selected row select line 18 of a memory matrix 19. In a typical example, the memory matrix 19 includes a 64×64 matrix of memory cells capable of strobing 4096 bits. In a typical example, each memory cell includes a single transistor memory cell 21 consisting of a storage capacitor 22 capable of storing an electrical potential corresponding to a "0" or a "1". The charge stored in the individual memory capacitor 22 is read out by a read/restore circuit 23, of conventional design, coupled to a respective column data line 24 of the matrix 19 via a row select transistor 25. The gates of the row select transistor 25 are coupled to the corresponding individually selectable row select lines 18. A respective one of the memory cells 22 is read out of the memory matrix 19 when its respective row select line 18 is energized at the same time that its respective column data line 24 is actively connected to the read/restore circuit 23.

If there are n number of address input signals $a_1-a_n$ received on terminals 12, there are $2^n$ decoder circuits 17 applying $2^n$ outputs to $2^n$ respective row select lines 18. In a typical example of a 64×64 bit memory 19 there are six input address signals $a_1-a_6$ received at the input of six address comparator buffers 13. The six pairs of complementary outputs A, $\overline{A}$ are fed to 64 decoder circuits 17. Only one of the address decoders 17 provides a true output on the 64 respective decoder output lines 29 to energize a selectively addressed row select line 18. The row select 18 is turned on via a respective interfacing transistor 26 which interfaces the memory matrix 19 to the respective decoder circuit 17. The selected row select line 18 is addressed during the output pulse of a row clock 27. The stored signal of the addressed memory cell 21 is read out and the stored signal restored into the memory cell 21 by means of the selected column data line 24 via the selected read/restore circuit 23.

The decoder circuit 17 includes an output line 29 which is precharged to a certain predetermined electrical potential via a charging transistor 31 connected between the line 29 and a source of precharging potential, such as $V_{DD}$, applied from a source to terminal 32. A precharging control signal $\overline{P}$ is applied to the gate electrode of the precharging transistors 31 for controlling charging of the line 29.

A plurality of decoding transistors 33 are connected in parallel to the decoder output line 29. The first or common terminals of the decoding transistors 33 are coupled to the decoder output line whereas the gate terminals 34 and the second or noncommon terminals 35 are connected across the output terminals 15 and 16 of the respective comparator buffer circuits 13. The decoder circuit connections are made to the respective comparator buffer circuits 13 so that only one of the $2^n$ decoder output lines 29 remains at the precharged potential after the outputs of all of the buffered address signals have been applied to the respective decoder circuits 17. All the other output lines 29, namely ($2^n-1$) lines are discharged to zero volts. The voltage on the respective decoder output line 29 is applied to the gate electrode of a respective buffer transistor 26 for energizing the addressed row select line 18.

Figure 4:
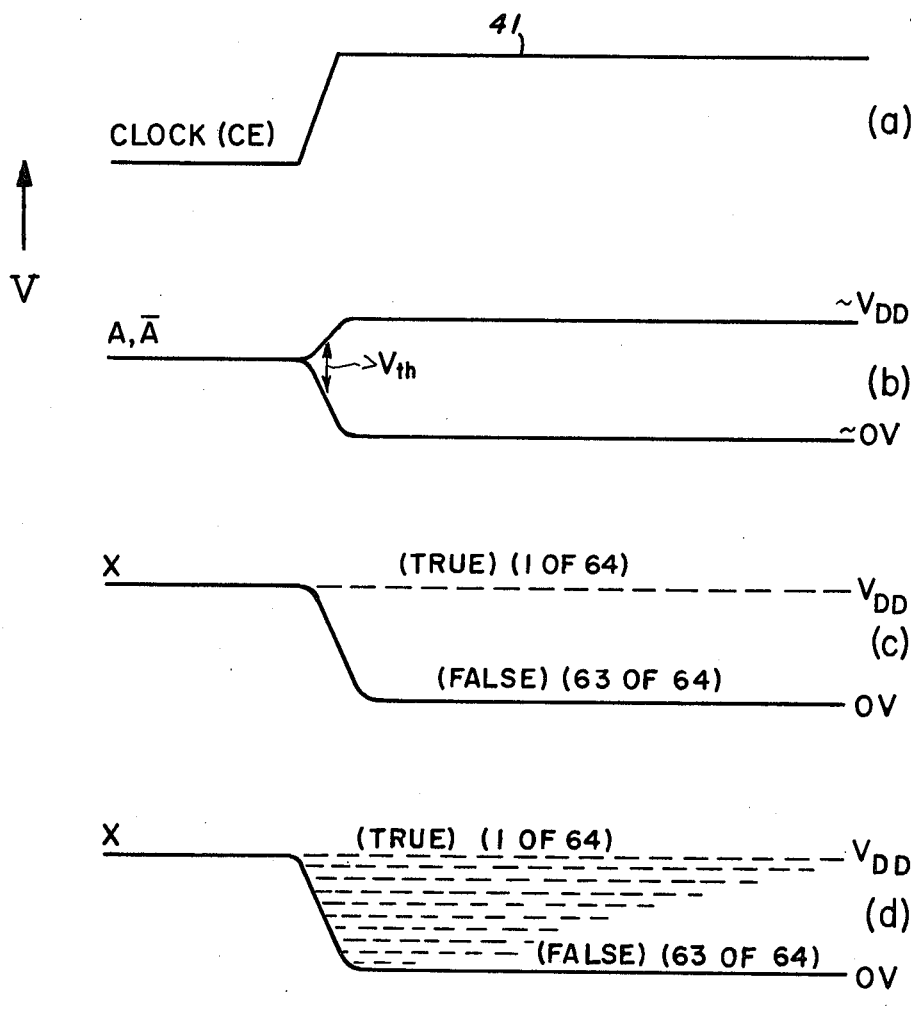
FIG. 4 is a timing diagram depicting various voltages in the circuit of FIG. 1 as a function of time and showing, in waveform (d), a prior art decoded address signal.

The timing of the respective signals is shown in waveforms (a), (b), and (c) of FIG. 4. More particularly, the clock or chip enable signal CE 41, upon a transition to a high state, causes the pairs of buffered address signals A and $\overline{A}$, which are initially at a common potential somewhere between $V_{DD}$, to initiate a transition to substantially different potentials, one of which is at approximately $V_{DD}$ and the other of which is approximately at ground or zero volts, as shown in waveform (b). As the pair of complementary output signals A, $\overline{A}$ diverge in amplitude, for a false output, they will exceed the turn-on threshold voltage $V_{th}$ of the respective decoder transistor 33 thereby turning on the respective decoder transistor and discharging the respective output line 29 to ground potential, as shown in waveform (c) of FIG. 4. One of the decoders will have all true inputs to its respective decoder transistors 33 and therefore its output X, as established on decoder output line 29, will remain at the precharged true potential $V_{DD}$ volts. This is shown in waveform (c). From FIG. 4 it is seen that the decoded output address signal X is timed from the divergence of the pair of complementary output address signals A, $\overline{A}$.

Figure 2:
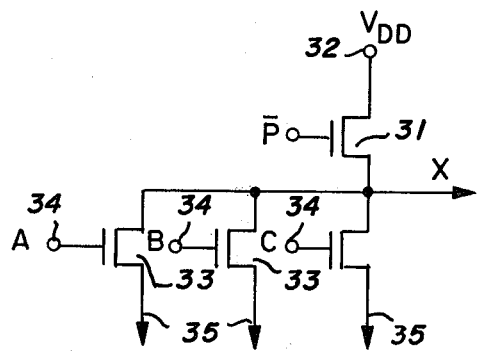
FIG. 2 is a schematic circuit diagram of a prior art decoder circuit for use in a memory circuit similar to that of FIG. 1.

Referring now to FIG. 2 there is shown the prior art decoder circuit which is essentially the same as that of FIG. 1 with the exception that the second terminals 35 to the decoding transistors 33 are all connected to ground and the control gates 34 are connected to receive the output signal of the comparator buffer circuit 13. One of the buffered output signals A, $\overline{A}$ is always ground and the other signal diverges from ground to provide the buffered address signals A, B, C, applied to the gate electrodes 34 of the decoding transistors 33. The problem with this arrangement, as aforementioned, is that the buffered address signals A, B, C, must be held at ground potential during the precharging portion of the cycle of the decoder circuit.

Figure 3:
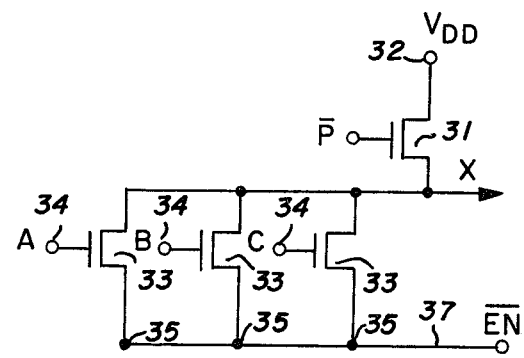
FIG. 3 is a schematic circuit diagram for an alternative prior art embodiment to that of FIG. 2.

Referring now to FIG. 3 there is shown another prior art decoder circuit. The decoder circuit of FIG. 3 is essentially the same as that of FIG. 2 with the exception that instead of the second terminals 35 to the decoding transistors 33 being grounded, such terminals 35 are connected to an enable bus 37 which must be held at or near the supply potential $V_{DD}$ during precharging and prior to decoding. Decoding occurs when an extra timing signal $\overline{EN}$, applied to bus 37, is taken to a potential close to ground potential. The enable signal $\overline{EN}$ must be delayed by a certain predetermined amount relative to the timing of the address signals A, B, C, applied to the gate terminals 34 of the decoding transistors 33 or else there is some unwanted discharging of the TRUE output potential $V_{DD}$ on the decoder output line 29, as shown by waveform (d) of FIG. 4. The dotted lines therein show various degrees of degradation of the TRUE signal, with the largest degradation corresponding to the least amount of delay between strobing of the buffer comparator circuit 13 and initiation of the enable signal $\overline{EN}$ applied to terminals 35 of the decoder circuit of FIG. 3. Since address delay is the single largest component experienced in reading out of an MOS memory, it is desired to keep the addressing delay to a minimum. Also, it is desired not to have to produce an extra timing signal $\overline{EN}$.

Thus, the advantage of the decoder circuit 17 of the present invention as employed in a dynamic random access MOS memory, as contrasted with the prior art, is that the buffered pairs of address signals $A_1, \overline{A}_1; A_2, \overline{A}_2 \ldots A_n, \overline{A}_n$ are not required to be at any particular voltage during precharging of the decoder output line 29 so long as each of such buffer address signals $A_1$ and $\overline{A}_1$ is at the same voltage during precharging. This is normally the case in an address decoder utilized in a dynamic random access memory where precharging is employed in the decoder circuit. Also the decoder is self-timing in that no separate timing signal for the decoder need be generated.

What is claimed is:

1. In an MOS dynamic random access memory:
memory means providing a matrix of individually selectable memory cells for storing data therein and for reading out data therefrom;
address input terminal means for receiving address input signals for addressing said memory means;
buffer means responsive to said input address signals on individual ones of said address input terminal means for generating pairs of complementary address signals in response to respective ones of said input address signals;
address decoder means responsive to said pairs of complementary address signals for producing a decoded memory accessing output signal for accessing an addressed cell in said memory means;
said address decoder means including, a decoder output line means on which said memory accessing decoder output signal is generated, means for precharging said decoder output line means to a predetermined electrical potential, a plurality of decoder transistor means coupled in parallel to said decoder output line means for selectively changing the potential of said decoder output line in response to said pairs of said complementary address signals, and wherein individual ones of said decoder transistor means includes first and second terminal means and a gate terminal means for gating current flow between said first and second terminal means, said first terminal means being coupled to said decoder output line means, and said gate and second terminal means of respective ones of said decoder transistor means being coupled to the output of respective ones of said buffer means to receive a respective one of said pair of complementary address signals thereon for controlling the conduction of current through respective ones of said decoder transistor means in response to the pair of complementary address signals applied between said gate and second terminals of respective ones of said decoder transistor means, whereby the timing of the conduction of current through respective ones of said decoder transistors is controlled by the generation of said pair of complementary address signals.

2. The apparatus of claim 1 wherein each of said individual buffer means includes, a clock input terminal means for strobing said buffer means to cause said pair of complementary output address signals to diverge from a common potential in response to a clock signal applied to said clock input terminal means, whereby when said pair of complementary output address signals have diverged from the common potential by a sufficient amount, the potential difference therebetween exceeds the turn-on threshold voltage of a respective one of said decoder transistor means resulting in rendering said decoder transistor means conductive for changing the precharged potential of said decoder output line means.

* * * * *